United States Patent
Fogel et al.

(10) Patent No.: US 9,935,215 B2
(45) Date of Patent: Apr. 3, 2018

(54) TRANSPARENT CONDUCTIVE ELECTRODE FOR THREE DIMENSIONAL PHOTOVOLTAIC DEVICE

(71) Applicant: INTERNATIONAL BUSINESS MACHINES CORPORATION, Armonk, NY (US)

(72) Inventors: Keith E. Fogel, Hopewell Junction, NY (US); Augustin J. Hong, White Plains, NY (US); Jeehwan Kim, Los Angeles, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/803,847

(22) Filed: Jul. 20, 2015

(65) Prior Publication Data
US 2015/0325713 A1 Nov. 12, 2015

Related U.S. Application Data

(63) Continuation of application No. 13/544,439, filed on Jul. 9, 2012, now Pat. No. 9,123,838, which is a (Continued)

(51) Int. Cl.
*H01L 31/0236* (2006.01)
*H01L 31/105* (2006.01)
(Continued)

(52) U.S. Cl.
CPC .. *H01L 31/02363* (2013.01); *H01L 31/02366* (2013.01); *H01L 31/022425* (2013.01);
(Continued)

(58) Field of Classification Search
CPC .................. H01L 31/02363; H01L 31/105
(Continued)

(56) References Cited

U.S. PATENT DOCUMENTS

| 5,527,716 A | 6/1996 | Kusian et al. |
| 5,956,572 A | 9/1999 | Kidoguchi et al. |

(Continued)

FOREIGN PATENT DOCUMENTS

| CN | 102222727 A * 10/2011 |
| WO | WO2010016468 A1 * 2/2010 |

OTHER PUBLICATIONS

Higashi et al., WO2010016468A1, English Machine Translation, Feb. 2010, WO, pp. 1-24.*

(Continued)

*Primary Examiner* — Tae-Sik Kang
(74) *Attorney, Agent, or Firm* — Tutunjian & Bitetto, P.C.; Louis J. Percello

(57) ABSTRACT

A photovoltaic device includes a substrate layer having a plurality of three-dimensional structures formed therein providing a textured profile. A first electrode is formed over the substrate layer and extends over the three-dimensional structures including non-planar surfaces. The first electrode has a thickness configured to maintain the textured profile, and the first electrode includes a transparent conductive material having a dopant metal activated within the transparent conductive material. A continuous photovoltaic stack is conformally formed over the first electrode, and a second electrode is formed on the photovoltaic stack.

10 Claims, 11 Drawing Sheets

Related U.S. Application Data continuation of application No. 13/535,868, filed on Jun. 28, 2012, now abandoned.

(51) Int. Cl.
    *H01L 31/0224*     (2006.01)
    *H01L 31/18*     (2006.01)
    *H01L 31/0352*     (2006.01)

(52) U.S. Cl.
    CPC ............ *H01L 31/022466* (2013.01); *H01L 31/022483* (2013.01); *H01L 31/035281* (2013.01); *H01L 31/105* (2013.01); *H01L 31/1884* (2013.01); *Y02E 10/50* (2013.01)

(58) Field of Classification Search
    USPC ............................................. 136/255; 438/71
    See application file for complete search history.

(56) References Cited

U.S. PATENT DOCUMENTS

| | | | |
|---|---|---|---|
| 6,040,521 | A | 3/2000 | Kushiya et al. |
| 6,239,474 | B1 | 5/2001 | Shinohara et al. |
| 8,026,438 | B2 | 9/2011 | Keshner et al. |
| 2009/0293936 | A1* | 12/2009 | Myong ............ H01L 31/02167 136/246 |
| 2010/0282314 | A1* | 11/2010 | Coakley ............ H01L 31/0236 136/258 |
| 2011/0023959 | A1* | 2/2011 | Yoo ................ H01L 31/022466 136/256 |
| 2011/0132442 | A1* | 6/2011 | Higashi .......... H01L 31/022466 136/252 |
| 2011/0186120 | A1 | 8/2011 | Krasnov |
| 2011/0277827 | A1* | 11/2011 | Yang ...................... B82Y 20/00 136/255 |
| 2011/0318871 | A1* | 12/2011 | Yamashita ............ C23C 14/185 438/98 |
| 2012/0015147 | A1 | 1/2012 | Maa et al. |
| 2012/0097215 | A1* | 4/2012 | Vermeersch ...... H01L 31/02008 136/246 |
| 2012/0118365 | A1* | 5/2012 | Bessonov ....... H01L 31/022466 136/255 |
| 2012/0146194 | A1* | 6/2012 | Roca I Cabarrocas ......... H01L 31/0236 257/618 |

OTHER PUBLICATIONS

Jianguo et al., CN102222727A, English Machine Translation, Oct. 2011, CN, pp. 1-4.*

Hegedus, S., et al. "Effect of Textured Tin Oxide and Zinc Oxide Substrates on the Current Generation in Amorphous Silicon Solar Cells" Conference Record of the Twenty Fifth IEEE Photovoltaic Specialists Conference. May 1996. pp. 1129-1132.

Kluth, O., et al. "Texture Etched Al-Doped ZnO: A New Material for Enhanced Light Trapping in Thin Film Solar Cells" Conference Record of the Twenty-Sixth IEEE Photovoltaic Specialists Conference, Sep. 1997. pp. 715-718.

Ruckh, M., et al. "Applications of ZnO in Cu(In,Ga)Se2 Solar Cells" Conference Record of the Twenty Fifth IEEE Photovoltaic Specialists Conference. May 1996. pp. 825-828.

Zhao, Z., et al. "Low-Cost High-Performance Transparent Conducting Oxide Films Fabricated by Combustion Chemical Vapor Deposition" Society of Vacuum Coaters 45th Annual Technical Conference. Apr. 2002. pp. 274-279.

Zhao, Z., et al. "Transparent Conducting ZnO:Al Films via CCVD for Amorphous Silicon Solar Cells" Conference Record of the Twenty-Ninth IEEE Photovoltaic Specialists Conference. May 2002. pp. 1282-1285.

* cited by examiner

TRANSPARENT CONDUCTIVE ELECTRODE FOR THREE DIMENSIONAL PHOTOVOLTAIC DEVICE

RELATED APPLICATION INFORMATION

This application is a Continuation application of copending U.S. patent application Ser. No. 13/544,439 filed on Jul. 9, 2012, which in turn is a Continuation application of abandoned U.S. patent application Ser. No. 13/535,868 filed on Jun. 28, 2012, both of which are incorporated herein by reference in their entirety.

BACKGROUND

Technical Field

The present invention relates to photovoltaic devices, and more particularly to devices and methods for fabricating photovoltaic devices with a textured electrode having improved properties.

Description of the Related Art

Solar panels employ photovoltaic cells to generate current flow. When a photon hits silicon, the photon may be transmitted through the silicon, reflected off the surface, or absorbed by the silicon if the photon energy is higher than the silicon band gap value. This generates an electron-hole pair and sometimes heat, depending on the band structure. The greater the absorption the greater the efficiency of the cell.

Textured substrate structures have been employed to increase the absorption efficiency. However, challenges arise at several points in the process. One such problem includes the formation of electrodes. An electrode deposition occurs by performing deep reactive ion etching (DRIE) the material followed by forming a thick layer of transparent electrode material to attempt to conform the electrode material to the shape of the underlying structure. DRIE is a highly anisotropic etch process making the formation of the textured surface template for subsequently deposited electrodes highly sensitive to thickness variations.

In addition, thinner material is preferred for electrodes conformally deposited on the textured substrate (with high aspect ratio) to maintain the textured profile. However, an electrode that is too thin results in sheet resistance problems (fill factor (FF) loss) and affects the efficiency of the solar cell. Further, laterally grown electrode materials can have different properties than planar grown materials. For example, laterally grown materials (on textured surfaces) have reduced transmittance as compared with planar grown materials.

SUMMARY

A photovoltaic device and method for forming the photovoltaic device include forming a plurality of three-dimensional structures in a substrate to form a textured profile. A first transparent electrode layer is formed on the structures from a transparent conductive oxide having a metal dopant and deposited at a thickness configured to maintain the textured profile. The first transparent electrode layer is annealed to increase conductivity and transmittance. A continuous photovoltaic stack including an N-type layer, a P-type layer and an intrinsic layer is formed on the first transparent electrode layer. A second electrode layer is deposited over the photovoltaic stack.

Another method for forming a photovoltaic device includes forming a plurality of three-dimensional structures in a substrate to form a textured profile, the textured profile including conically shaped peaks having non-perpendicular lateral surfaces configured to provide light trapping; depositing a first transparent electrode layer on the structures, from a transparent conductive oxide having a metal dopant, at a thickness configured to maintain the textured profile, the thickness configured to maintain the textured profile including a thickness of less than 450 nm; annealing the first transparent electrode layer at a temperature of between about 300 degrees to about 600 degrees Celsius and a duration of between 5 seconds and 90 seconds to increase conductivity and transmittance; forming a continuous photovoltaic stack including an N-type layer, a P-type layer and an intrinsic layer on the first transparent electrode layer; and depositing a second electrode layer over the photovoltaic stack.

Yet another method for forming a photovoltaic device includes forming a plurality of three-dimensional structures in a substrate to form a textured profile, the textured profile including conically shaped peaks having non-perpendicular lateral surfaces configured to provide light trapping; depositing a ZnO:Al layer on the structures including over non-planar surfaces at a thickness configured to maintain the textured profile, the thickness ranging between about 250 nm and about 350 nm; annealing the first transparent electrode layer at a temperature of between about 300 degrees to about 600 degrees Celsius and duration of between 5 seconds and 90 seconds to activate the Al to increase conductivity and to increase transmittance; forming a continuous photovoltaic stack including an N-type layer, a P-type layer and an intrinsic layer on the first transparent electrode layer; and depositing a second electrode layer over the photovoltaic stack.

A photovoltaic device includes a substrate layer having a plurality of three-dimensional structures formed therein providing a textured profile. A first electrode is formed over the substrate layer and extends over the three-dimensional structures including non-planar surfaces. The first electrode has a thickness configured to maintain the textured profile, and the first electrode includes a transparent conductive material having a dopant metal activated within the transparent conductive material. A continuous photovoltaic stack is conformally formed over the first electrode, and a second electrode is formed on the photovoltaic stack.

A photovoltaic device includes a substrate layer having a plurality of three-dimensional structures formed therein providing a textured profile. A first electrode is formed over the substrate layer and extends over the three-dimensional structures including non-planar surfaces. The first electrode has a thickness configured to maintain the textured profile, the first electrode including ZnO:Al wherein the Al is activated. A continuous photovoltaic stack is conformally formed over the first electrode. The photovoltaic stack includes a P-type layer, an N-type layer and an intrinsic layer disposed therebetween. A second electrode is formed on the photovoltaic stack.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
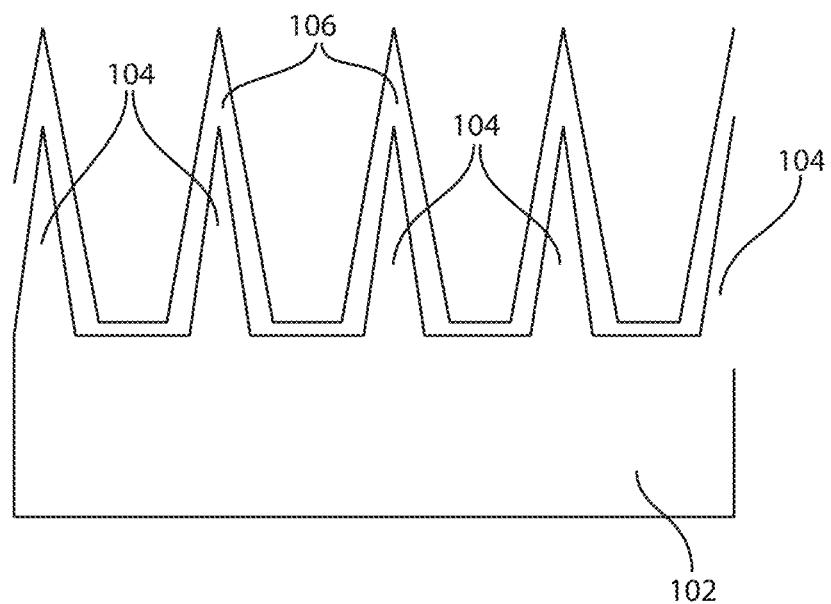
FIG. 1 is a cross-sectional view of a photovoltaic device having a plurality of three-dimensional structures with a first electrode formed thereon in accordance with one embodiment.

Photovoltaic devices and methods for fabricating photovoltaic devices are provided. The devices in accordance with the present principles provide the benefits of textured structures without suffering from sheet resistance and fill factor loss due to lateral deposition of electrode materials. A substrate layer having structures or textures is configured to provide a vertical component for radiation absorption layers (e.g., a p-type-intrinsic-n-type (p-i-n) stack). The vertical component may include a hill and trough structure or a conical structure having vertically disposed surfaces or sides that carry the light absorbing material. The sides provide a depth and angle to increase the likelihood of absorption of radiation. In this way, the structures provide higher absorption efficiency.

In one embodiment, an electrode is formed by depositing a thin layer of transparent conductive electrode material. The layer of transparent conductive electrode material is thin enough to prevent the loss of the conical shaped structures in the textured surface. The conical shaped structures provide a shape that maximizes light absorption in three dimensions. However, the thin layer may give rise to sheet resistance issues and/or poor transmittance. The present principles enable the use of a thin layer of transparent conductive electrode material that preserves the textured structure and improves conductivity resulting in improved device performance. The electrode material is subjected to an anneal process that increases grain size especially for laterally formed electrode materials to mimic conductivities only achievable in thicker layers. In one embodiment, the electrode is preferably doped with a metal dopant, such as Al, which is activated by the anneal process to further enhance conductivity and other properties.

It is to be understood that the present invention will be described in terms of given illustrative architectures for a solar cell; however, other architectures, structures, substrate materials and process features and steps may be varied within the scope of the present invention. A circuit formed using these structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips and/or solar cells. The resulting integrated circuit chips or cells can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes photovoltaic devices, integrated circuit chips with solar cells, ranging from toys, calculators, solar collectors and other low-end applications to advanced products.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring now to the drawings in which like numerals represent the same or similar elements and initially to FIG. 1, an illustrative photovoltaic structure 100 is depicted in accordance with one embodiment. The photovoltaic structure 100 may be employed in solar cells, light sensors or other photovoltaic applications. Structure 100 includes a substrate 102. The substrate 102 includes cone shaped structures 104, which are preferably part of the substrate 102, although in some embodiments the structures 104 may be grown from the substrate 102. The structures 104 may be fabricated by any number of processes, such as forming mechanical grooves, employing a nanodot or other pattern and etching the substrate, etching holes in the substrate, growing pillars, etc. The substrate 102 may include a silicon material, a glass, quartz or other etchable transparent substrate material. In another embodiment, the substrate 102 may include an opaque material, such as a metal or polymer. A silicon substrate may include a single (monocrystalline) silicon or a polycrystalline silicon (polysilicon). While other substrate materials may be employed silicon based materials including glass are preferred for transparent substrate embodiments.

Figure 2:
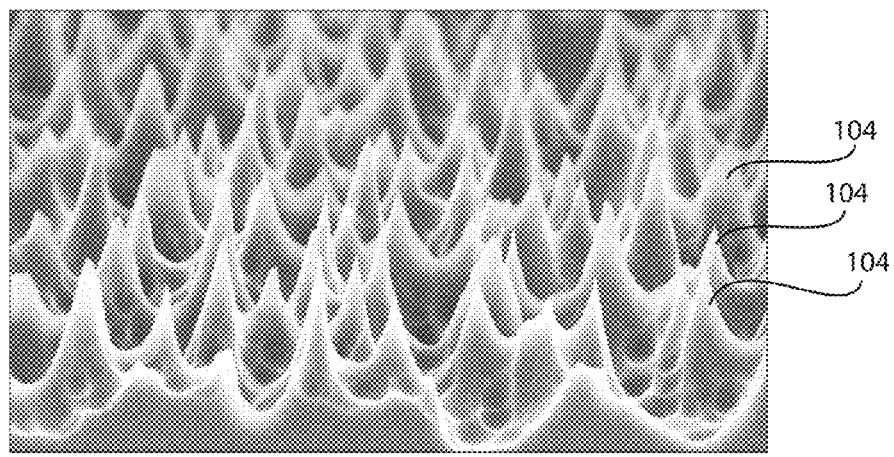
FIG. 2 is a scanning electron microscope (SEM) image showing three-dimensional structures forming a textured profile in accordance with one embodiment.

The structures 104 form three-dimensional shapes, which are preferably conical to enhance light trapping. The structures 104 assist in increasing the surface area of absorption and provide for radiation trapping between the structures 104. The structures 104 may be constructed to receive light with the structures 104 facing out (e.g., toward the light) or facing in. FIG. 2 illustratively shows structures 104 formed from a glass substrate by a masked etching process. The structures 104 increase the surface area and therefore the collection efficiency in any incident light direction as compared to a flat surface cell. Therefore, it is advantageous to maintain a textured profile provided by the structures 104. The structures 104 may include a height of about one micron, although larger or smaller pillars are contemplated.

Referring again to FIG. 1, a first electrode layer 106 is formed on structures 104 preferably by a deposition process, such as, e.g., chemical vapor deposition (CVD), sputtering, etc. Other formation processes are also contemplated. The first electrode layer 106 may include a transparent conductive material such as a transparent conductive oxide (TCO) (e.g., zinc oxide, indium tin oxide, indium zinc oxide, etc.). The deposition process may include in-situ doping of a metal, such as Al or other conductive element or dopant, or the metal may be implanted or diffused after formation by a suitable doping process. When forming the first electrode layer 106, it is preferable to provide a thicker layer, e.g., 500 nm or greater to attempt to overcome the high sheet resistance and lower transmittance issues that can occur in three-dimensional (non-planar) deposited TCO. However, the conical shape and profile of the structures may be lost due to the deposition properties of the TCO material.

Figure 3:
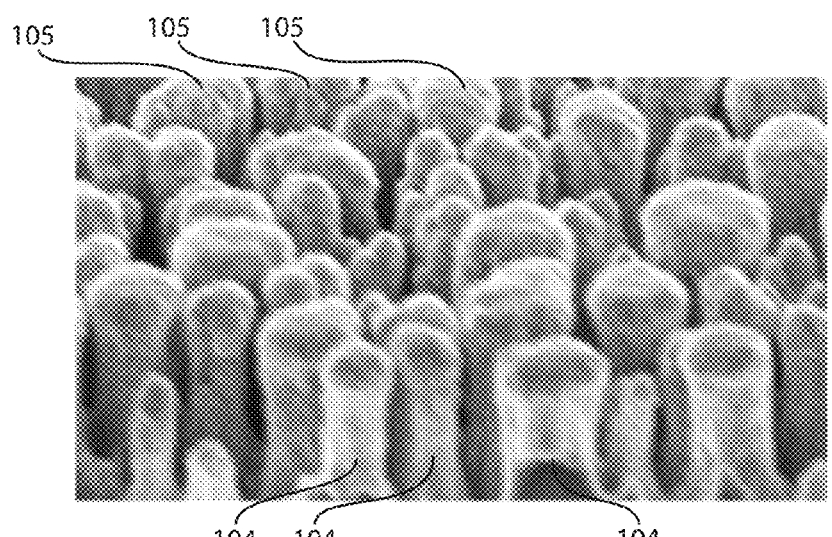
FIG. 3 is a SEM image showing a thick ZnO:Al layer formed such that the thick deposition washes out the textured profile.

FIG. 3 illustratively depicts structures 104 having a 600 nm ZnO layer 105 deposited thereon. Such a layer 105 may include a transmittance greater than 85% and a sheet resistance of less than 10 Ohms/sq. However, the cone shapes of the structures 104 are masked and/or washed out forming nearly perpendicular pillars relative to a major plane of the substrate. Many advantages including light trapping effects are lost as a result.

Figure 4:
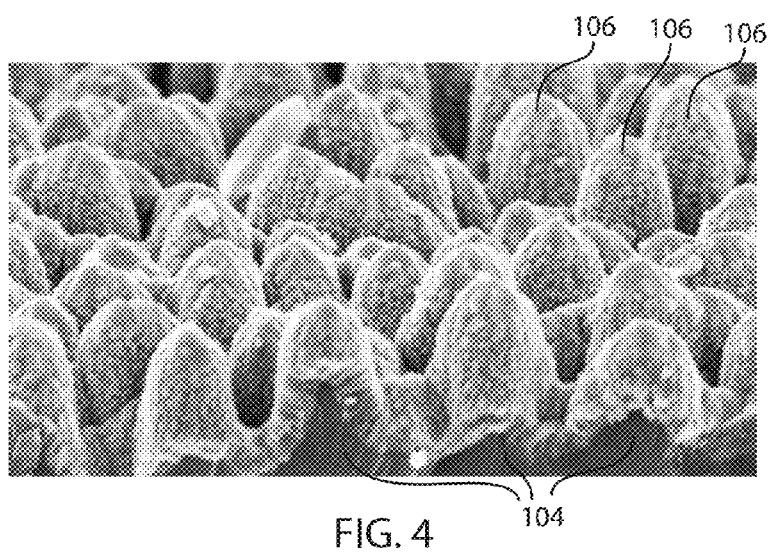
FIG. 4 is a SEM image showing a thinner ZnO:Al layer formed such that the thin deposition preserves the textured profile and conically shaped features in accordance with one embodiment.

In accordance with the present principles, the first electrode 106 is deposited having a thickness less than about 450 nm, and preferably between about 100 nm to about 350 nm. In this way, the conical or cone shaped profile provided by the structures 104 can be preserved. FIG. 4 illustratively depicts structures 104 having a 300 nm ZnO:Al layer 106 deposited thereon. The cone shapes of the structures 104 are preserved and provide light trapping effects. In accordance with one aspect of the present principles, by employing a TCO with metal dopants (ZnO:Al), an anneal can be performed on the three-dimensional (textured) thin electrode layer 106 to improve conductivity and transmittance. The first electrode may be etched (e.g., a wet etch or deep reactive ion etch) to refine the textured shape. The wet etching process results in a simultaneous reduction and narrowing of the shape. The wet etching process may include a hydrochloric acid (HCl) although other etchants may be employed, e.g., HF, HNO3, etc.

The anneal may include a temperature of between about 300 degrees Celsius and about 600 degrees Celsius, for a duration of between 5 seconds and about 90 seconds. In one embodiment, the temperature is in a range of about 400 to about 525 degrees Celsius, for between about 20 to 40 seconds. The RTA has been observed to densify the TCO material and the inventors believe that in the presence of a metal dopant, such as Al, the metal is activated within the TCO to provide electrical improvements to the three-dimensional TCO material.

Figure 5:
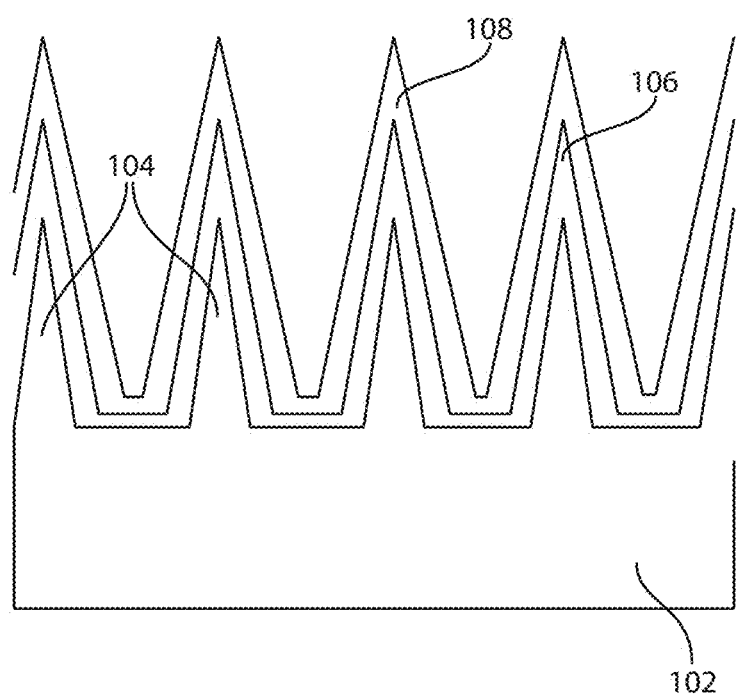
FIG. 5 is a cross-sectional view of a photovoltaic device formed on the first electrode in accordance with one embodiment.

Referring to FIG. 5, a p-i-n (or n-i-p) diode stack (or stacks) 108 is formed over the first electrode 106. The stack 108 preferably includes a first doped layer (p-doped layer), and intrinsic layer (i-layer) and a second doped layer (n-doped layer). The stack 108 may be formed using a plasma enhanced chemical vapor deposition (PECVD) process. The stack 108 provides active areas for absorbing radiation and converting the radiation into charge flow as is known in the art. A plurality of different materials may be selected for the layers in stack 108. In one particularly useful embodiment, the first and second doped layers may include doped polycrystalline/microcrystalline silicon, silicon and carbon compounds, germanium, silicon germanium, etc., and the intrinsic layer may include undoped amorphous silicon-containing materials. It should be understood that other layers and features may be included, such as contact layers, etc., or even multiple photovoltaic stacks may be employed.

Figure 6A:
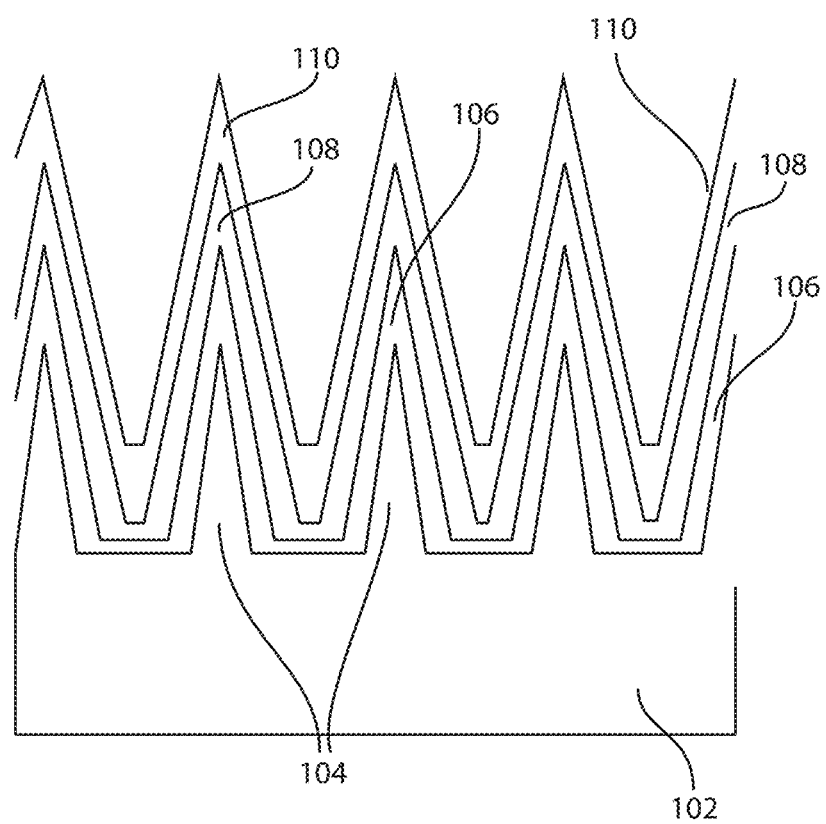
FIG. 6A is a cross-sectional view of a second electrode formed on the photovoltaic stack of FIG. 5 in accordance with one embodiment.

Referring to FIG. 6A, a second electrode 110 is formed on the stack 108. The second electrode 110 may include a transparent conductive material such as a transparent conductive oxide (TCO) (e.g., zinc oxide, doped zinc oxide, tin oxide, a fluorine-doped tin oxide, indium tin oxide, indium zinc oxide, etc.), metal or other conductive structure. The deposition process may include a sputtering process, CVD, physical vapor deposition or other suitable deposition process. In this embodiment, second electrode 110 forms a bottom electrode for the device 100 formed from, e.g., ZnO:Al.

In other embodiments, the second electrode 110 may include a 100 nm ZnO:Al with a 100-200 nm Ag or Al back reflector layer. A ZnO:Al/Al (or Ag) stack is better for back reflection as compared to only Ag (or Al) or only ZnO:Al. In still other embodiments, a very thick ZnO:Al (e.g., >1 micron) is deposited for high conductivity with white paint for total back reflection. The bottom electrode 110 is preferably formed having a larger thickness to improve the conductivity. The thickness may be 200 nm or greater for a ZnO material. However, in one embodiment, the bottom electrode 110 may be employed for collecting light as well (two-sided device) and/or the textured profile may be desirable for the bottom electrode as well for maximized back reflection.

Figure 6B:
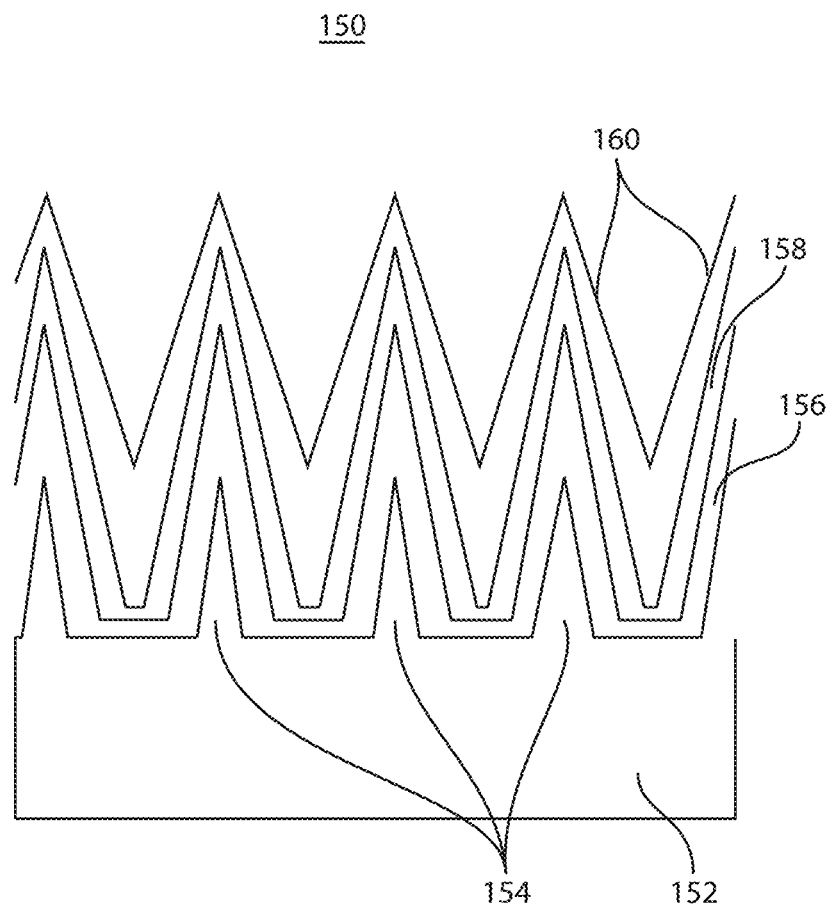
FIG. 6B is a cross-sectional view of a photovoltaic device having a plurality of three-dimensional structures with an opaque substrate (e.g. substrate opposite light receiving surface) in accordance with an alternate embodiment.

FIG. 6B shows an alternate embodiment of a photovoltaic device 150 having a metal or opaque substrate 152, having structures 154 formed therein. In one embodiment, the substrate 152 includes, e.g., Al, although other materials may be employed, and in particular materials with high reflectance properties to function as a back reflector. The substrate 152 is processed to form conical shapes or a textured profile by, e.g., masked etching, etc. Next, a TCO layer 156, such as, e.g., ZnO:Al may be formed having the properties (e.g., thickness, etc.) and dimensions as described above to maintain the textured profile. The TCO layer 156 is annealed to improve at least the conductivity (similar to layer 106). A photovoltaic stack 158 is formed on the TCO layer 156, which includes a p-type layer, an intrinsic layer and an n-type layer. Another TCO layer 160 is formed on the photovoltaic stack 158.

Figure 7A:
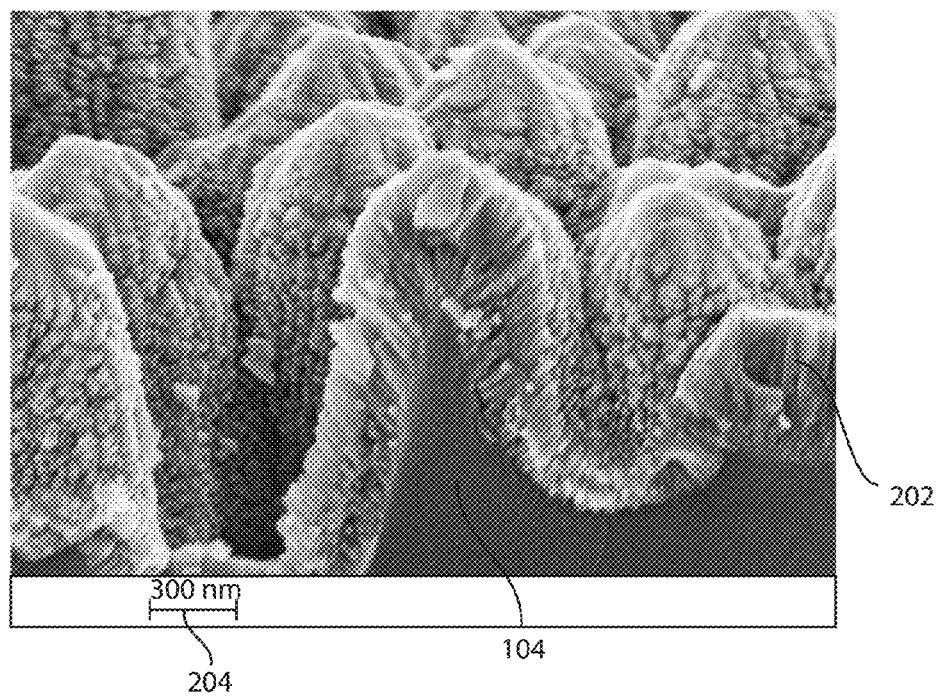
FIG. 7A is a SEM image of a three-dimensional surface of a ZnO layer as deposited in accordance with one embodiment.
Figure 7B:
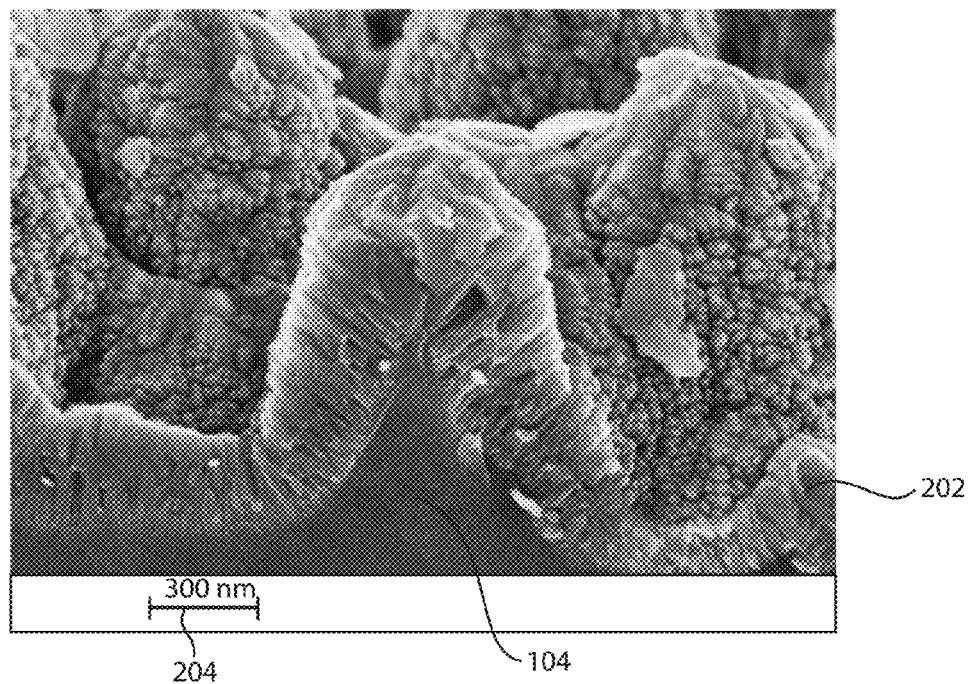
FIG. 7B is a SEM image of the ZnO layer of FIG. 7A after annealing in accordance with one embodiment.
Figure 7C:
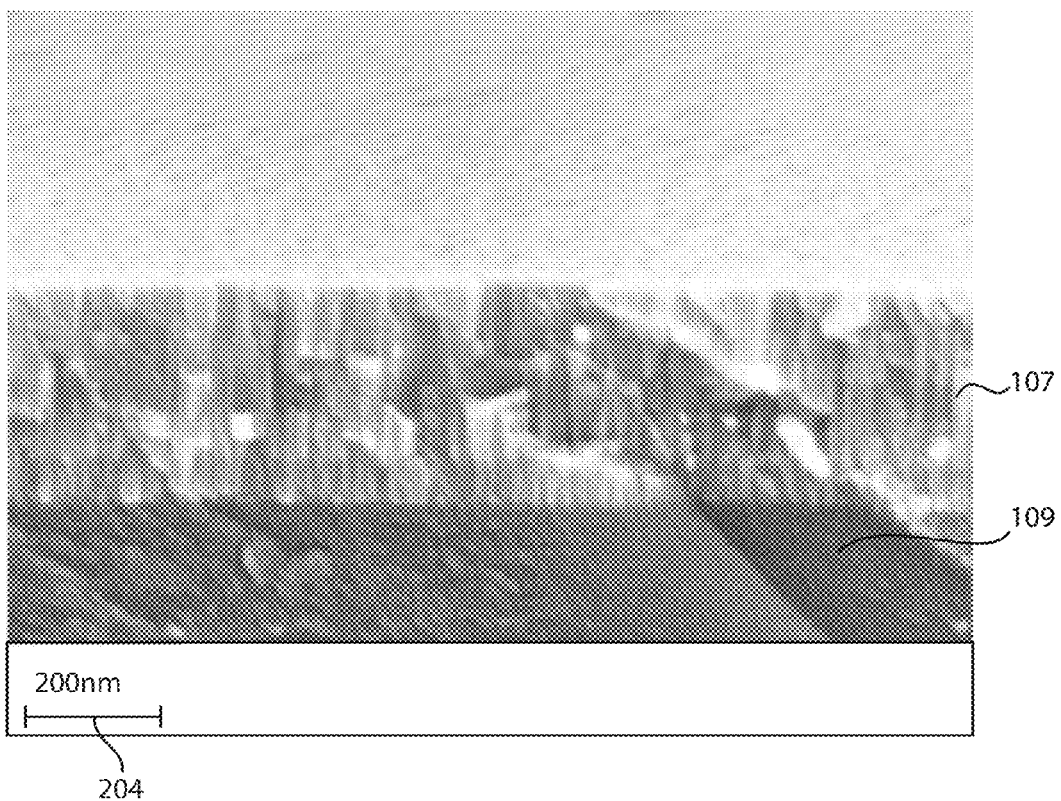
FIG. 7C is a SEM image of a planar layer as deposited for comparison.

Referring to FIG. 7A, a scanning electron microscope (SEM) image shows a three-dimensional ZnO:Al layer 202 having a thickness of about 300 nm formed on structures 104. The image includes a scale 204 of 300 nm. FIG. 7B shows a SEM image of the layer 202 after a 350 degrees Celsius, 30 second, anneal process. The layer 202 shows increased density and more prominent needle-like grains formed transversely to a surface of the structures 104. The structure of the three-dimensional TCO material (ZnO) can be compared to that of a planar deposition 107 of ZnO on a substrate 109 in FIG. 7C, which shows a different morphology as compared to FIGS. 7A and 7B.

Figure 8:
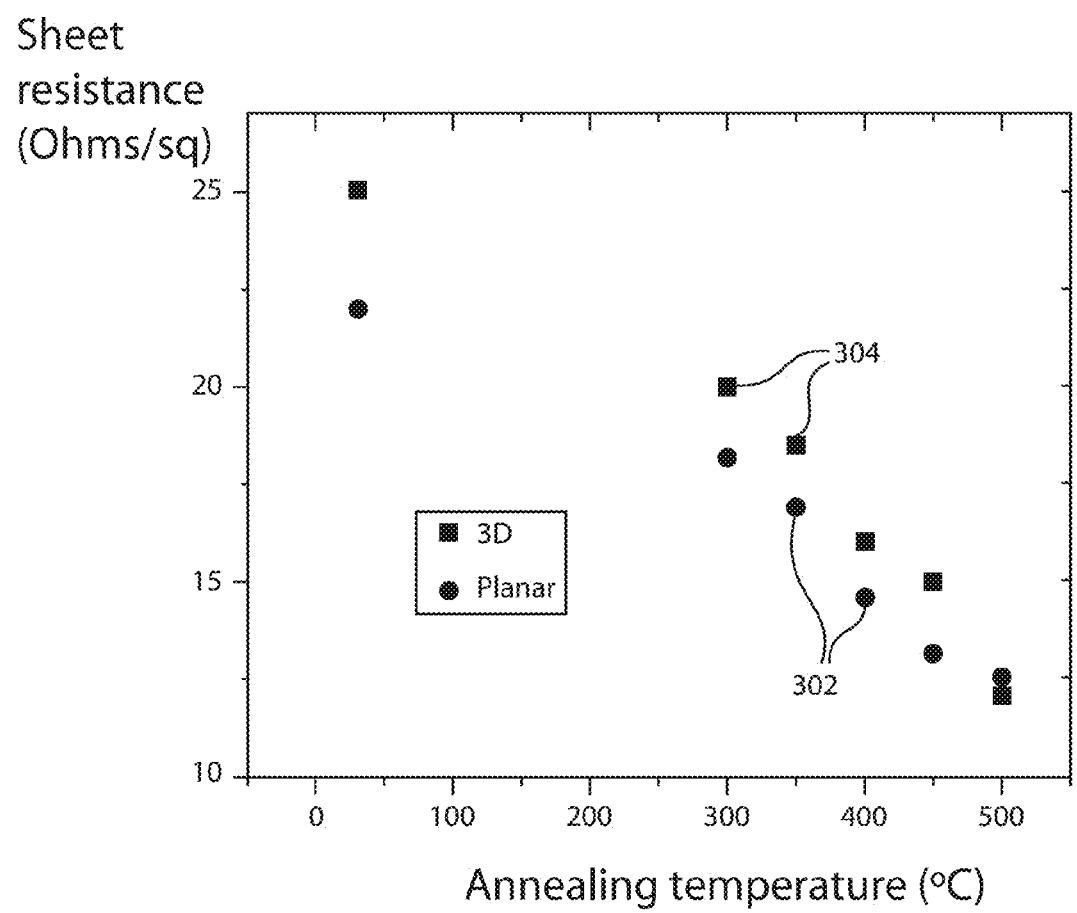
FIG. 8 is a graph showing electrical properties between a three-dimensional (textured) ZnO:Al layer and a planar ZnO:Al layer by plotting sheet resistance (Ohms/sq) versus annealing temperature (degrees C.)

Referring to FIG. 8, a graph shows electrical properties between a three-dimensional (textured) ZnO:Al layer (302) and a planar ZnO:Al layer (304) by plotting sheet resistance (Ohms/sq) versus annealing temperature (degrees C.). At lower anneal temperatures the three-dimensional ZnO:Al has poorer conductivity than the planar ZnO:Al; however, dramatic conductivity improvements are achieved upon annealing so that the three-dimensional ZnO:Al has comparable or slightly better conductivity at anneal temperatures over about 450 degrees C.

Figure 9:
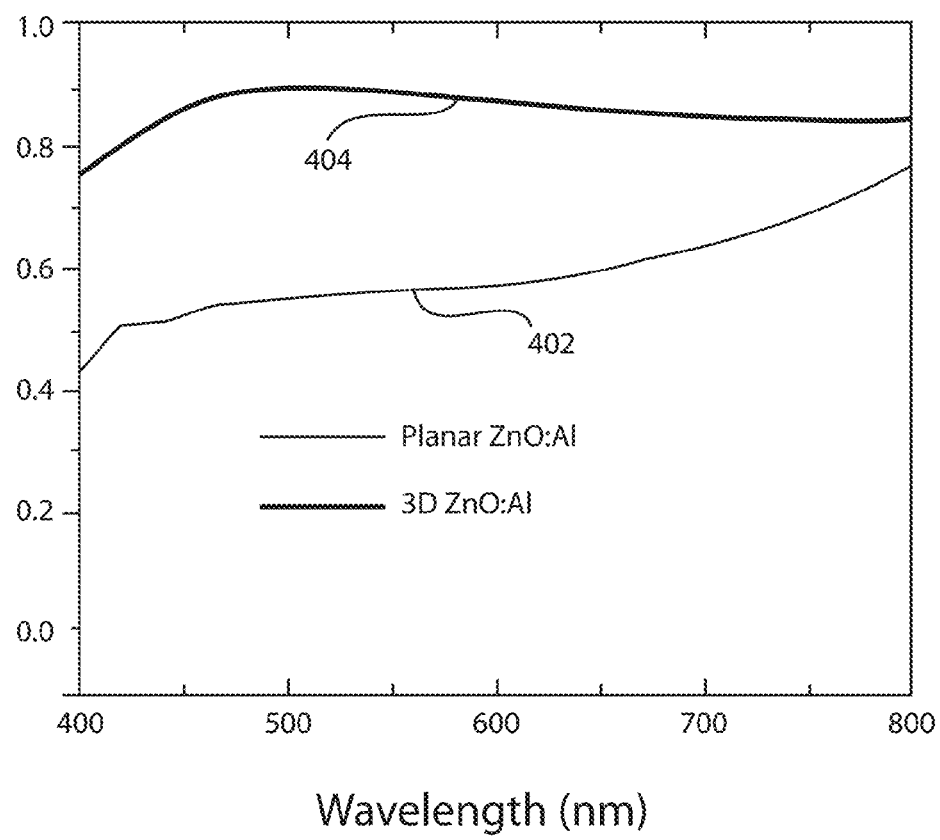
FIG. 9 is a graph showing transmittance properties between a three-dimensional (textured) ZnO:Al layer and a planar ZnO:Al layer by plotting transmittance (%) versus wavelength (nm) for layer thicknesses of 300 nm.

Referring to FIG. 9, a graph shows transmittance properties between a three-dimensional (textured) ZnO:Al layer (402) and a planar ZnO:Al layer (404) by plotting transmittance (%) versus wavelength (nm) for layer thicknesses of 300 nm. For the wavelengths in the range, the planar ZnO:Al has a higher transmittance than the three-dimensional ZnO:Al (i.e., laterally grown ZnO:Al).

Figure 10:
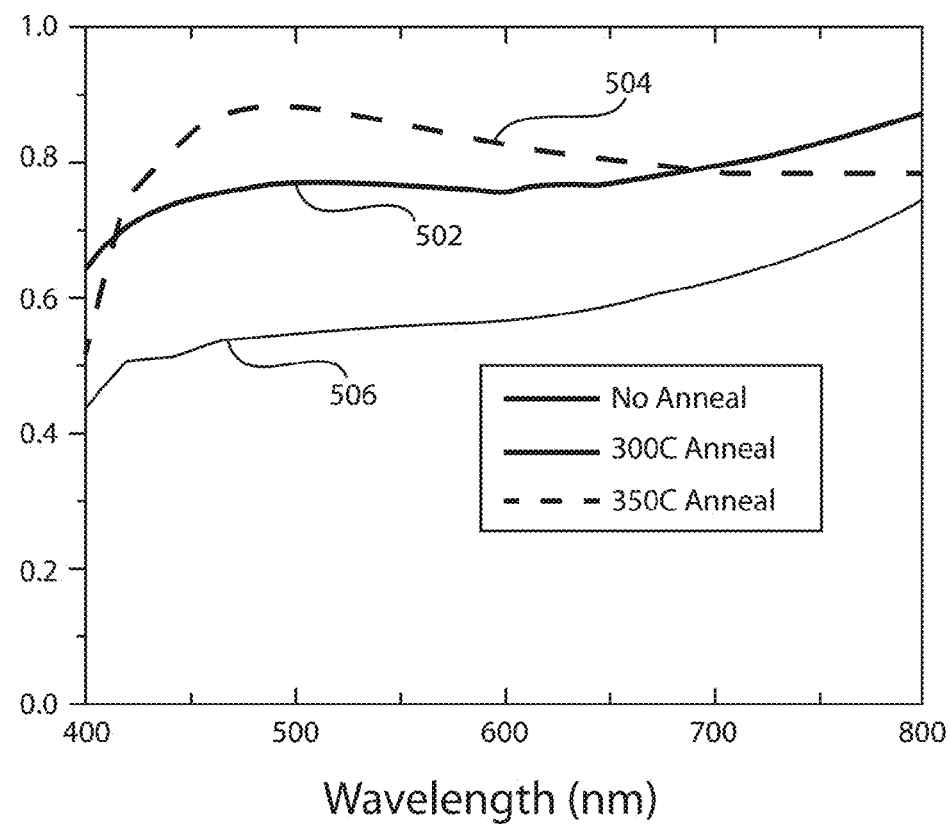
FIG. 10 is a graph showing transmittance properties of a three-dimensional (textured) ZnO:Al layer for two different anneal temperatures (300 and 350 degrees C.) and for no anneal.

Referring to FIG. 10, a graph shows transmittance properties of a three-dimensional (textured) ZnO:Al layer for two different anneal temperatures (300 and 350 degrees C.) (plots 502 and 504, respectively) and for no anneal (506). Transmittance (%) is plotted versus wavelength (nm) for a layer thickness of 300 nm. For the wavelengths in the range, the 350 degrees C. anneal provided transmittances near the planar ZnO:Al (FIG. 9). With higher anneal temperatures, the transmittances can exceed those achieved by thicker and/or planar layers.

Figure 11:
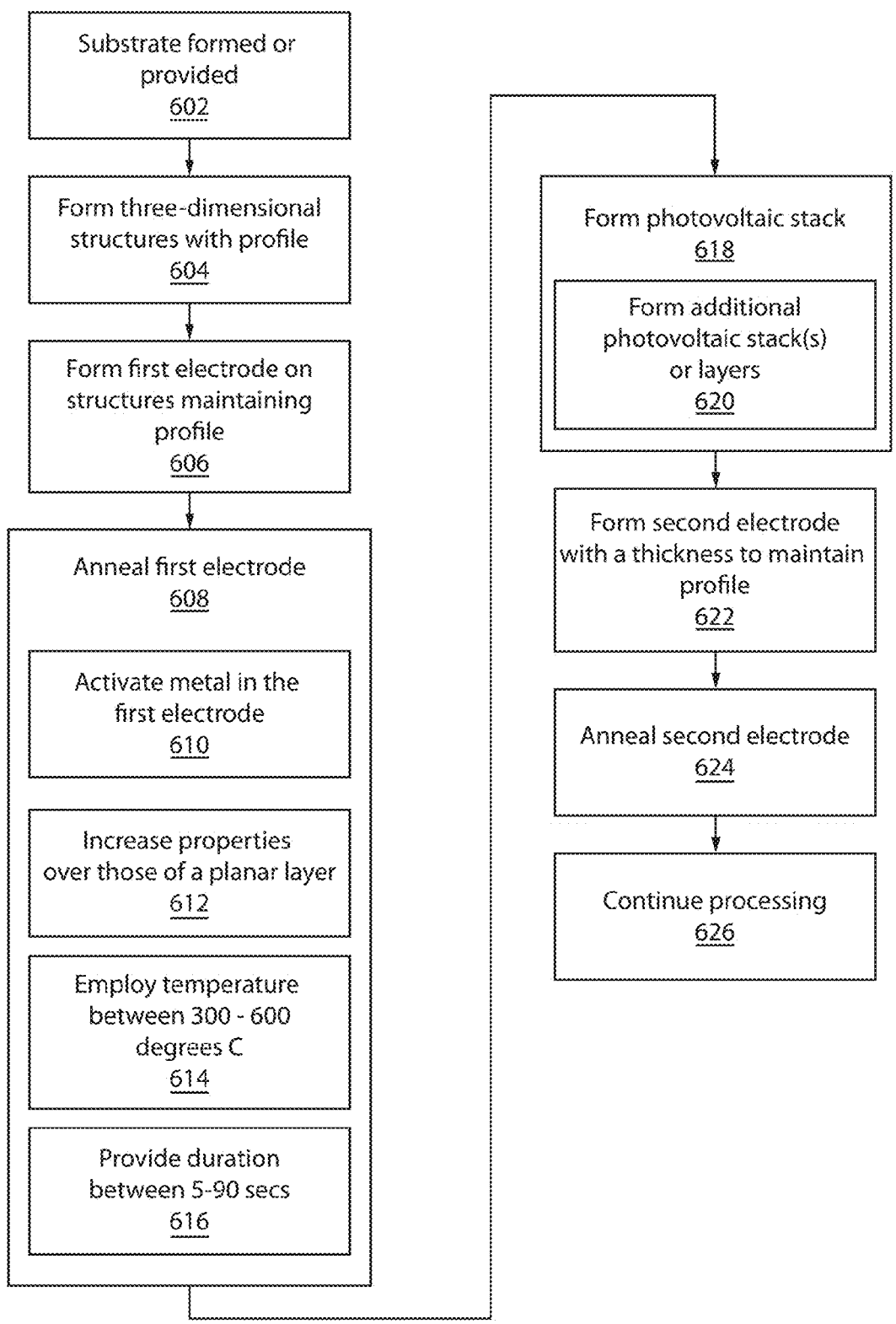
FIG. 11 is a flow diagram showing methods for fabricating a photovoltaic device in accordance with the present principles.

Referring to FIG. 11, methods for forming a photovoltaic device in accordance with illustrative embodiments are shown. The flowchart/block diagram in the FIG. 11 illustrates the functionality, and operation of possible implementations of methods according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

In block 602, a substrate layer is provided. In attempting to reduce cost, the present principles prefer the use of a non-semiconductor substrate layer material. For example, the substrate may include glass or metal. In block 604, a plurality of three dimensional structures is formed in the substrate to form a textured profile. This may include mechanically forming a plurality of grooves, chemically etching conical structures, etc. Other methods include using 3D structuring such as embossing, stamping, molding, etc. for forming conically shaped structures. The conically shaped structures include conically shaped peaks having non-perpendicular lateral surfaces configured to provide light trapping.

In block 606, a first transparent electrode layer is formed on the structures preferably from a transparent conductive oxide (TCO) material. The TCO is preferably doped with a metal (e.g., Al). The TCO is deposited at a thickness configured to maintain the textured profile. This thickness may include 450 nm or less and preferably between about 250 and 350 nm. The thickness is configured to ensure that the textured profile is maintained.

In block 608, the first transparent electrode layer is annealed to increase conductivity and transmittance. In block 610, annealing is performed on the first transparent electrode layer to activate the dopant (e.g., Al) to increase the conductivity. In block 612, the annealing process preferably increases conductivity and transmittance to at least equal to a planar formed layer of a same transparent conductive oxide material as the first transparent electrode layer. In block 614, the anneal process may include a temperature of between about 300 degrees to about 600 degrees Celsius. In block 616, the anneal process may include a duration of between 5 seconds and 90 seconds.

In block 618, a continuous photovoltaic stack is formed on the first electrode. The stack may include an N-type layer, a P-type layer and an intrinsic layer disposed between the N and P-type layers. Additional photovoltaic stacks and other layers may also be formed on the continuous photovoltaic stack in block 620.

In one embodiment, in block 622, a second electrode is formed over the photovoltaic stack(s). The second electrode may include a transparent conductive oxide material. In block 624, the second electrode may be annealed using a same or similar process as for the first electrode to increase conductivity and transmittance and maintain the textured profile. The second electrode layer may include a thickness of less than 500 nm and may be configured to maintain the textured profile (e.g., based on its thickness and annealing to improve the properties of the second electrode). The second electrode preferably includes a transparent conductive oxide, such as e.g., ZnO. In block 626, additional processing may be performed including forming additional layers or features including back reflectors, etc.

Having described preferred embodiments for a transparent conductive electrode for three dimensional photovoltaic device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
  forming a plurality of three-dimensional silicon structures from a silicon substrate to form a textured profile by a masked etching process;
  forming a first transparent electrode layer directly on the silicon substrate, above the plurality of three-dimensional silicon structures formed by the masked etching process, from a transparent conductive oxide doped with a metal;

annealing the first transparent electrode layer to increase conductivity and transmittance and to form more prominent needle-like grains formed transversely to the textured profile than needle-like grains of the first transparent electrode layer before the annealing;

etching the transparent electrode layer to reduce and narrow the more prominent needle-like grains; and forming a continuous photovoltaic stack including an N-type layer, a P-type layer and an intrinsic layer directly on the first transparent electrode layer.

2. The method as recited in claim 1, wherein the first transparent electrode layer has a thickness of less than 450 nm and maintains the textured profile.

3. The method as recited in claim 1, wherein the plurality of three-dimensional silicon structures include conically shaped peaks having non-perpendicular lateral surfaces configured to provide light trapping.

4. The method as recited in claim 1, wherein the transparent conductive oxide includes ZnO and the metal includes Al.

5. The method as recited in claim 1, wherein the step of forming the first transparent electrode layer includes depositing a ZnO:Al layer at about 300 nm in thickness and the step of annealing comprises annealing the first transparent electrode layer to activate the Al to increase the conductivity.

6. The method as recited in claim 1, wherein the step of annealing includes annealing the first transparent electrode layer at a temperature of between about 300 degrees to about 600 degrees Celsius.

7. The method as recited in claim 1, wherein the step of annealing includes annealing the first transparent electrode layer for a duration of between 5 seconds and 90 seconds.

8. The method as recited in claim 1, further comprising depositing a second electrode layer over the continuous photovoltaic stack.

9. The method as recited in claim 8, wherein the second electrode layer includes a transparent conductive oxide material, and further comprising:

annealing the second electrode layer to increase conductivity and transmittance and to maintain the textured profile.

10. The method as recited in claim 8, wherein the second electrode layer includes a thickness of less than 500 nm and is configured to maintain the textured profile.

\* \* \* \* \*